(12) United States Patent
Jia

(10) Patent No.: US 11,641,728 B2
(45) Date of Patent: May 2, 2023

(54) HOUSING AND ELECTRONIC DEVICE

(71) Applicant: GUANGDONG OPPO MOBILE TELECOMMUNICATIONS CORP., LTD., Guangdong (CN)

(72) Inventor: Yuhu Jia, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 48 days.

(21) Appl. No.: 17/535,169

(22) Filed: Nov. 24, 2021

(65) Prior Publication Data

US 2022/0087067 A1    Mar. 17, 2022

Related U.S. Application Data

(63) Continuation of application No. PCT/CN2020/088868, filed on May 7, 2020.

(30) Foreign Application Priority Data

Jun. 12, 2019 (CN) .......................... 201910508109.9

(51) Int. Cl.
*H05K 5/00* (2006.01)
*H05K 7/20* (2006.01)

(52) U.S. Cl.
CPC ....... *H05K 7/20336* (2013.01); *H05K 5/0017* (2013.01); *H05K 5/0086* (2013.01); *H05K 7/2099* (2013.01); *H05K 7/20436* (2013.01)

(58) Field of Classification Search
CPC ........... H05K 7/20336; H05K 7/20436; H05K 7/2099; H05K 5/0017; H05K 5/0086
See application file for complete search history.

(56) References Cited

U.S. PATENT DOCUMENTS

2017/0367219 A1    12/2017 Hsieh et al.
2019/0004574 A1*    1/2019 Wang ................... G06F 1/1626

FOREIGN PATENT DOCUMENTS

| CN | 204482215 | 7/2015 |
|---|---|---|
| CN | 105578840 | 5/2016 |

(Continued)

OTHER PUBLICATIONS

CNIPA, First Office Action for CN Application No. 201910508109.9, dated Mar. 2, 2020.

(Continued)

*Primary Examiner* — Mukundbhai G Patel
(74) *Attorney, Agent, or Firm* — Hodgson Russ LLP

(57) ABSTRACT

Provided are a housing and an electronic device. The housing comprises a middle frame, a heat-conducting element and a protective member. The middle frame is provided with a first receiving area configured to receive an electronic component of an electronic device. The middle frame is further provided with an accommodating groove. The accommodating groove penetrates the middle frame and is communicated with the first receiving area. The heat-conducting element is accommodated in the accommodating groove. The protective member is at least partially accommodated in the accommodating groove, and is arranged at a side of the heat-conducting element that faces towards the first receiving area. In the embodiments, the protective member is opposite to or in contact with the electronic component arranged in the first receiving area, and separates the heat-conducting element accommodated in the accommodating groove from the electronic component arranged in the first receiving area.

20 Claims, 6 Drawing Sheets

(56) References Cited

FOREIGN PATENT DOCUMENTS

| CN | 106207038 | 12/2016 |
|---|---|---|
| CN | 106304817 | 1/2017 |
| CN | 108646891 | 10/2018 |
| CN | 108777255 | 11/2018 |
| TW | M522552 | 5/2016 |

OTHER PUBLICATIONS

CNIPA, Second Office Action for CN Application No. 201910508109.9, dated Jul. 13, 2020.
CNIPA, Notification to Grant Patent Right for Invention for CN Application No. 201910508109.9, dated Nov. 3, 2020.
WIPO, International Search Report for PCT/CN2020/088868, dated Jun. 24, 2020.
EPO, Extended European Search Report for EP Application No. 20822550.8, dated May 17, 2022.

\* cited by examiner

continued

HOUSING AND ELECTRONIC DEVICE

CROSS-REFERENCE TO RELATED APPLICATION

This application is a continuation of International Application PCT/CN2020/088868, filed on May 7, 2020, which claims priority to Chinese Patent Application No. 201910508109.9, filed on Jun. 12, 2019. The entire disclosures of the aforementioned applications are incorporated herein by reference.

TECHNICAL FIELD

This disclosure relates to the field of consumer electronics, and particularly to a housing and an electronic device.

BACKGROUND

With the technological development of electronic devices, more and more electronic devices are involved in people's daily life. As the performance and functions of the electronic devices, such as mobile phones and tablets, are getting higher and higher, the heating problem of these electronic devices is becoming more and more serious.

In the related electronic devices, the heat dissipation is mainly performed by adding a heat dispersing material with a good thermal conductivity, such as graphite or copper foil, inside the electronic device, so that the heat is transferred, through the heat dispersing material, to the metal part of the casing of the electronic device, and finally dissipated to the outside of the electronic device, to lower the temperature of the electronic device. However, since different electronic components are located at different locations, heat concentration can be easily caused in the electronic device. In this case, arranging the heat dispersing material such as the graphite or copper foil is still insufficient to dissipate the heat concentrated at each location in time. Thus, the electronic device has a poor heat dissipation effect.

SUMMARY

Provided in the present disclosure is a housing for an electronic device. The housing includes a middle frame, a heat-conducting element, and a protective member. The middle frame is provided with a first receiving area configured to receive an electronic component of the electronic device. The middle frame is also provided with an accommodating groove, the accommodating groove penetrates the middle frame and is communicated with the first receiving area. The heat-conducting element is accommodated in the accommodating groove. The protective member is at least partially accommodated in the accommodating groove, and is arranged on a side of the heat-conducting element that faces the first receiving area.

Further provided in the present disclosure is an electronic device. The electronic device includes the housing mentioned above, a first electronic component and a display panel. The first electronic component is accommodated in the first receiving area, and is arranged opposite the protective member. The display panel is arranged on a side of the middle frame that is away from the first receiving area.

Further provided in the present disclosure is an electronic device. The electronic device includes the housing mentioned above, a first electronic component, and a second electronic component. The first electronic component is arranged in the first receiving area of the middle frame. The second electronic component is connected to the middle frame, and is spaced apart from the first electronic component. The protective member includes a first section and a second section connected to the first section. The first section is arranged opposite the first electronic component, and the second section is arranged opposite the second electronic component.

BRIEF DESCRIPTION OF THE DRAWINGS

In order to more clearly describe the technical solutions in the embodiments of the present disclosure, drawings needed in the description of the embodiments will be briefly introduced below. Obviously, the drawings in the following illustrate only some embodiments of the present disclosure. For those skilled in the art, other drawings can also be obtained based on these drawings without any creative effort.

DETAILED DESCRIPTION OF PREFERRED EMBODIMENTS

Figure 1:
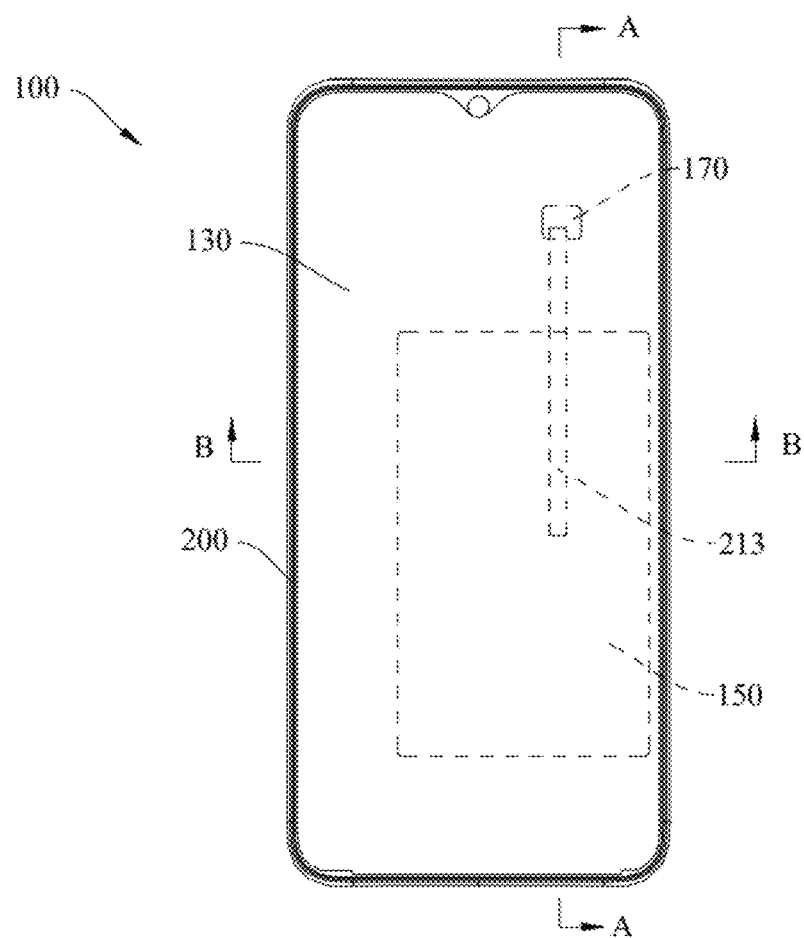
FIG. 1 is a schematic diagram illustrating a front projection of an electronic device provided by the embodiments of the disclosure.

The technical solutions in the embodiments of the present disclosure will be clearly and comprehensively described below in conjunction with the drawings in the embodiments of the present disclosure. Obviously, the described embodiments are only a part of the embodiments of the present disclosure, rather than all the embodiments. Based on the embodiments in this disclosure, all other embodiments obtained by those of ordinary skill in the art without any creative work shall fall within the protection scope of this disclosure.

The technical solutions in the embodiments of the present disclosure will be clearly and comprehensively described below in conjunction with the drawings in the embodiments of the present disclosure.

In the related electronic devices, the heat dissipation is mainly performed by adding a heat dispersing material with a good thermal conductivity, such as graphite or copper foil, inside the electronic device, so that the heat is transferred, through the heat dispersing material, to the metal part of the casing of the electronic device, and finally is dissipated to the outside of the electronic device, to lower the temperature of the electronic device. However, since different electronic components are located at different locations, heat concentration can be easily caused in the electronic device. In this case, by arranging the heat dispersing material such as the graphite or copper foil, it is insufficient to dissipate the heat concentrated at each location in time. Thus, the electronic device has a poor heat dissipation effect.

In view of this, the inventor has conducted a lot of researches on the heat dissipation structure of the electronic device. The inventor found that the local overheating of the electronic device can be avoided by means of a heat pipe that guides the heat generated at the heat source to a battery compartment for heat balance and dissipation. In addition, in order not to increase the thickness of the electronic device such as the mobile phone, the battery compartment may be perforated locally. However, due to the perforation in the battery compartment, a lower end of the heat pipe is likely to be partially dislocated during the reliability test and the use of the whole device, which may damage the battery and bring safety hazards to the electronic device.

Accordingly, the inventor continues to study how to prevent the dislocation of the heat pipe and thus protect the battery without changing the thickness of the electronic device, so as to realize the heat balance and heat dissipation of the electronic device, thereby improving the heat dissipation performance of the electronic device. Among them, the inventor has researched how to avoid the dislocation of the heat pipe in the electronic device, how to make the positions of the heat pipe and the battery relatively fixed, how to make the heat dissipation structure dissipate the heat rapidly in the electronic device, and so on. After a large number of comparisons and researches, the inventor further conducted research on how to design a heat dissipation structure that enables heat balance in the electronic device, and thus proposed the technical solutions of the embodiments of the present disclosure.

Figure 2:
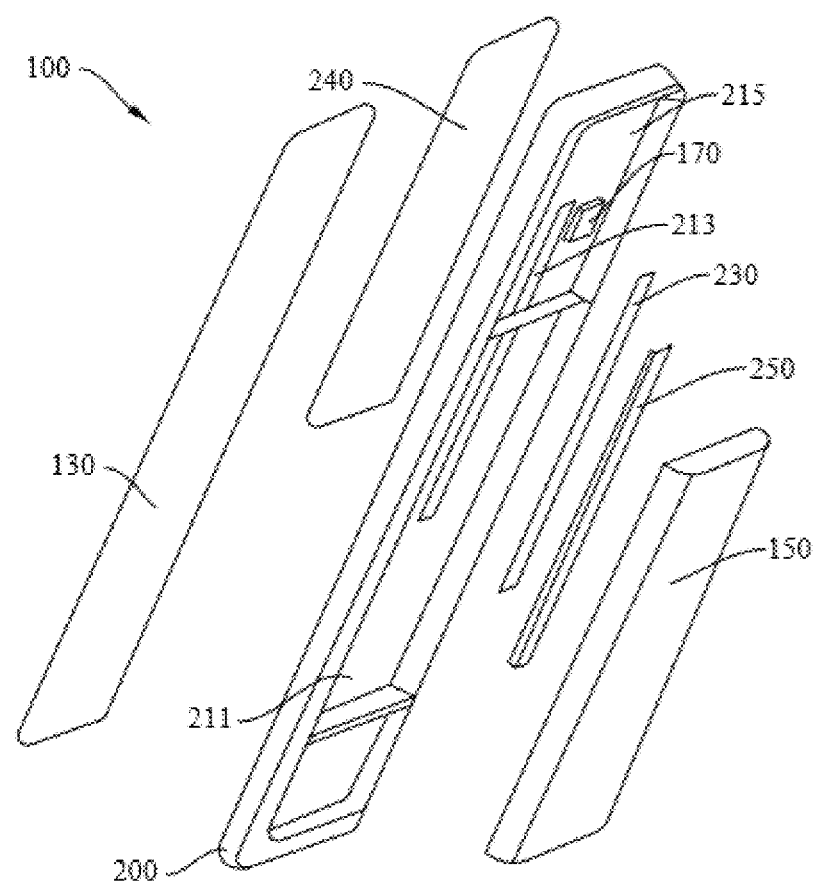
FIG. 2 is an exploded view of the electronic device shown in FIG. 1.

Referring to FIG. 1 and FIG. 2, the embodiments of the present disclosure provide an electronic device 100. The electronic device 100 may be, but is not limited to, a mobile phone, a tablet computer, a smart watch and other electronic devices. It is illustrated in the embodiments of the disclosure by taking a case where the electronic device 100 is a mobile phone as an example.

The electronic device 100 includes a housing 200, a display panel 130, a first electronic component 150, and a second electronic component 170. The housing 200 and the display panel 130 cooperatively define a receiving cavity, and the first electronic component 150 and the second electronic component 170 are accommodated in the receiving cavity. The housing 200 can provide protection for the first electronic component 150 and the second electronic component 170, to prevent the first electronic component 150 and the second electronic component 170 from being dislocated or damaged under the impact of an external force, thereby prolonging the service life of the electronic device 100.

In the embodiments of the present disclosure, the display panel 130 is a screen capable of displaying related interfaces or information of the electronic device 100 for the user to watch or operate. In the embodiments, the first electronic component 150 is a battery, that is, the first electronic component 150 is an energy supply component of the electronic device 100 that provides the power required for the normal operation of the electronic device 100. The second electronic component 170 includes any one or more of a central processing unit, a camera, a fingerprint recognition module, and a sensor. The second electronic component 170 is electrically connected with the display panel 130 and the first electronic component 150 to enable the related functions of the electronic device 100. The specific structures of the first electronic component 150, the second electronic component 170 and the display panel 130 are not detailed here.

It should be noted that the first electronic component 150 and the second electronic component 170 generate heat during operation, and the heat generated by the first electronic component 150 and the second electronic component 170 accounts for a large proportion of the heat generated by the electronic device 100, that is, the first and second electronic components are the main heat source of the electronic device. In other words, the heat generated by the first electronic component 150 and the second electronic component 170 would cause the electronic device 100 to heat, which affects the usage experience and service life of the electronic device 100.

Figure 3:
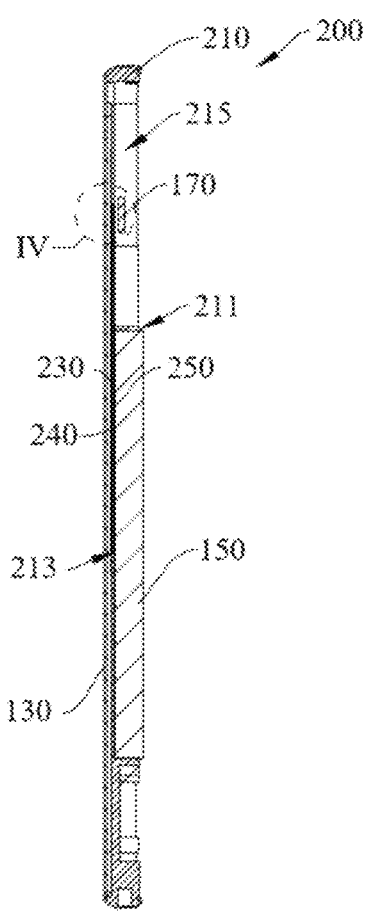
FIG. 3 is a schematic cross-sectional view of the electronic device shown in FIG. 1 taken along line A-A.

Referring to FIG. 3, the housing 200 includes a middle frame 210, a heat-conducting element 230 and a protective member 250. The middle frame 210 is provided with a first receiving area 211, and the first receiving area 211 is configured to install the first electronic component 150. The middle frame 210 is further provided with an accommodating groove 213. The accommodating groove 213 penetrates the middle frame 210 in a thickness direction of the middle frame, and is communicated with the first receiving area 211. The heat-conducting element 230 is accommodated in the accommodating groove 213. The protective member 250 is at least partially accommodated in the accommodating groove 213, and is located on a side of the heat-conducting element 230 that faces towards the first receiving area 211.

The protective member 250 is arranged opposite or in contact with the first electronic component 150 provided in the first receiving area 211. As such, the heat generated by the first electronic component 150 is transferred, through the protective member 250 and the heat-conducting element 230, to other locations of the electronic device 100, and then is dissipated to the outside. Accordingly, the heat balance of the electronic device 100 is achieved, and the local overheating of the electronic device 100 is avoided, thereby improving the heat dissipation efficiency of the electronic device 100. In addition, by providing the protective member 250, it is possible to prevent the first electronic component 150 from being damaged by the heat-conducting element 230 when the heat-conducting element is dislocated (for example, when it is impacted by an external force, or when the structure is loose), thereby improving the reliability of the electronic device 100.

Specifically, the middle frame 210 is configured to install or carry the first electronic component 150 and the second electronic component 170 to limit the positions of the first electronic component 150 and the second electronic component 170, thereby avoiding malfunction of the electronic device 100 from being caused by the displacement of the first electronic component 150 and the second electronic component 170.

In the embodiments, the middle frame 210 is further provided with a second receiving area 215. The second receiving area 215 is configured to install the second electronic component 170 to limit the position of the second electronic component 170. Further, the second receiving area 215 and the first receiving area 211 are located on a same side of the middle frame 210, and the second receiving area 215 is arranged adjacent to the first receiving area 211. Correspondingly, the first electronic component 150 and the second electronic component 170 are located on the same side of the middle frame 210. Optionally, the volume of the second electronic component 170 is smaller than the volume of the first electronic component 150. Therefore, the space occupied by the second receiving area 215 in the middle frame 210 may be smaller than the space occupied by the first receiving area 211 in the middle frame 210.

Figure 4:
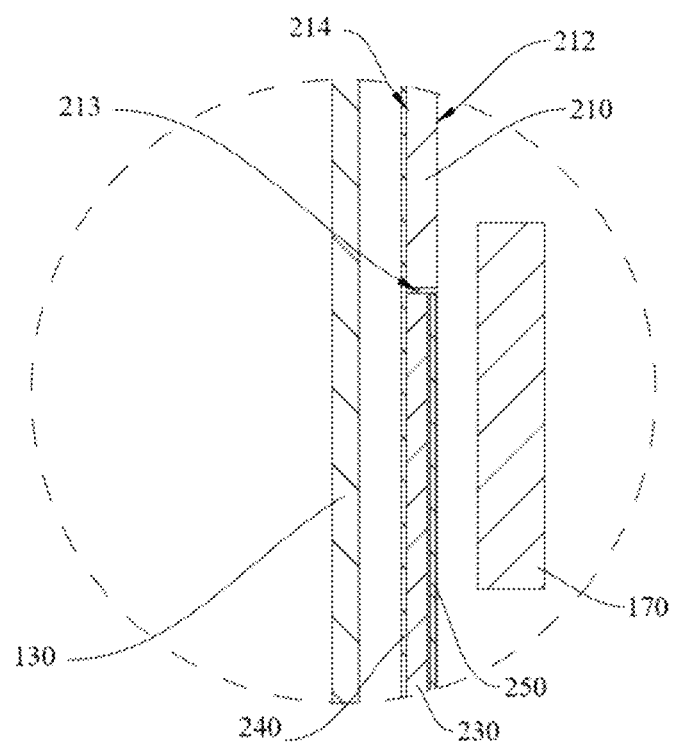
FIG. 4 is an enlarged schematic diagram of region IV of the electronic device shown in FIG. 3.

Referring to FIG. 4, in the embodiments of the present disclosure, the middle frame 210 includes a first surface 212 and a second surface 214 that face away from each other. The first receiving area 211 and the second receiving area 215 are both provided on the first surface 212. Optionally, the first receiving area 211 and the second receiving area 215 each have a frame-like structure protruding from the first surface 212, to limit the positions of the first electronic component 150 and the second electronic component 170. It is understandable that, when the first receiving area 211 and the second receiving area 215 are in the frame-like structures, the first surface 212 may serve as the bottom wall of the first receiving area 211 and the second receiving area 215, so that the first electronic component 150 received in the first receiving area 211 and the second electronic component 170 received in the second receiving area 215 are further confined.

In some embodiments, the first receiving area 211 and the second receiving area 215 may be located on opposite sides of the middle frame 210. For example, the first receiving area 211 is provided on the first surface 212, and the second receiving area 215 is provided on the second surface 214.

It should be noted that the division of the first receiving area 211 and the second receiving area 215 is just to distinguish the area where the first electronic component 150 is received from the area where the second electronic component 170 is received in the electronic device 100, for ease of description, which does not limit the embodiments.

Figure 5:
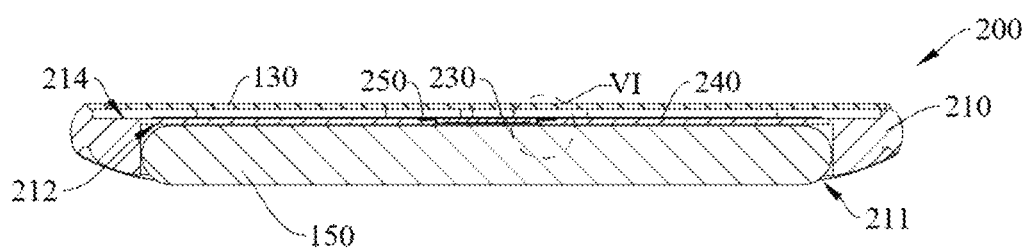
FIG. 5 is a schematic cross-sectional view of the electronic device shown in FIG. 1 taken along line B-B.

Referring to FIG. 5, in the embodiment of the present disclosure, the display panel 130 is disposed on a side of the middle frame 210 that is away from the first receiving area 211, that is, the display panel 130 is substantially opposite to the second surface 214. Through this arrangement, the display panel 130 is arranged on one side of the middle frame 210, and the first electronic component 150 and the second electronic component 170 are arranged on the opposite side of the middle frame 210, that is, the display panel 130 and the first and second electronic component 150 and 170 are respectively arranged on two sides of the middle frame 210, so that the internal structure of the electronic device 100 is reasonable.

Figure 6:
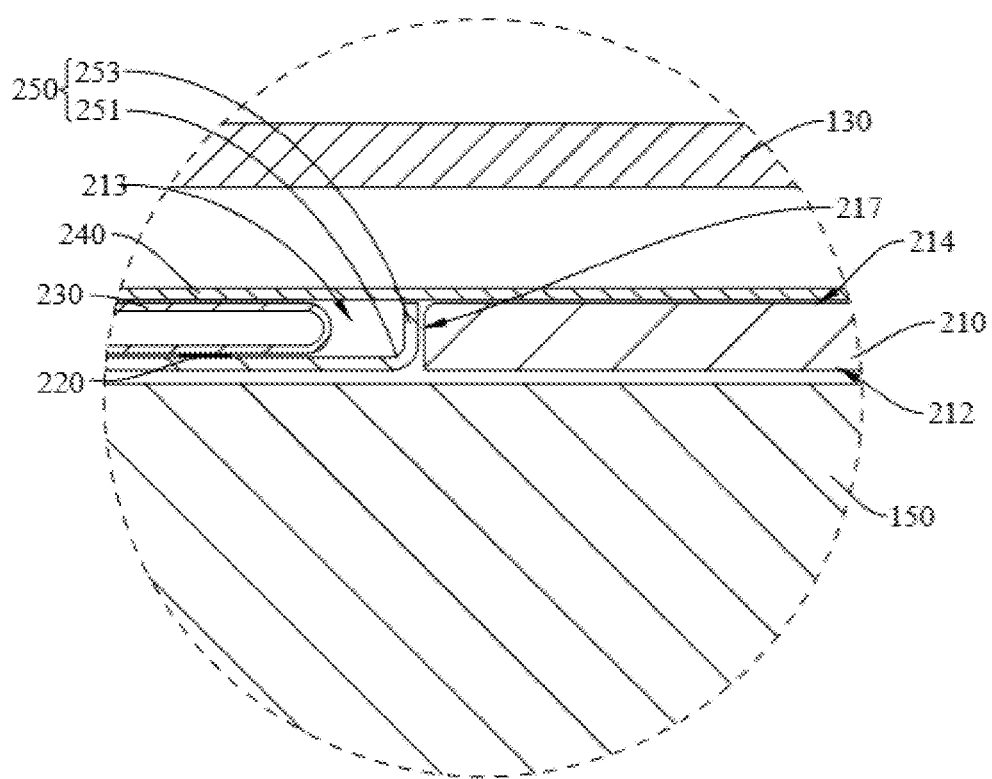
FIG. 6 is an enlarged schematic diagram of an implementation of region VI of the electronic device shown in FIG. 5.

Further, referring to FIG. 6, the middle frame 210 further includes an inner wall 217 located between the first and second surfaces and substantially perpendicular to each of the first and second surfaces, and the accommodating groove 213 is enclosed by the inner wall 217. The accommodating groove 213 penetrates the first surface 212 and the second surface 214, and is communicated with the first receiving area 211 and the second receiving area 215. That is, the accommodating groove 213 penetrates the bottom walls of the first receiving area 211 and the second receiving area 215.

In the embodiments of the present disclosure, the accommodating groove 213 is substantially a rectangular groove, and the first receiving area 211 and the second receiving area 215 are respectively provided at two ends of the accommodating groove 213. The two ends of the accommodating groove 213 refer to two relatively short edges of the accommodating groove 213. Accordingly, two sides of the accommodating groove 213 refer to two relatively long edges of the accommodating groove 213. Optionally, when the first receiving area 211 and the second receiving area 215 are arranged side by side or adjacent to each other, the accommodating groove 213 may span across the first receiving area 211 and the second receiving area 215, and be communicated with the first receiving area 211 and the second receiving area 215. In some embodiments, when the first receiving area 211 and the second receiving area 215 are located on two sides of the middle frame 210, the two ends of the accommodating groove 213 may be communicated with the first receiving area 211 and the second receiving area 215, respectively.

Referring to FIG. 6, the protective member 250 is disposed in the accommodating groove 213, and spans across the first receiving area 211 and the second receiving area 215. In other words, the two opposite ends of the protective member 250 are respectively located at the first receiving area 211 and the second receiving area 215, to cover an opening formed by the accommodating groove 213 in the first receiving area 211 and an opening formed by the accommodating groove 213 in the second receiving area 215.

In the embodiments, the protective member 250 can cover the opening formed by the accommodating groove 213 in the first receiving area 211. For example, the protective member 250 can cover the side of the accommodating groove 213 that is communicated with the first receiving area 211. By providing the protective member 250 to cover the opening formed by the accommodating groove 213, the heat-conducting element 230 cannot easily fall off from the accommodating groove 213, thereby improving the heat dissipation stability of the housing 200.

The protective member 250 includes a main body 251 and a bent part 253 connected to the main body 251. In the embodiments, the main body 251 is substantially sheet-shaped, and it substantially covers the side of the accommodating groove 213 that is communicated with the first receiving area 211. The bent part 253 is connected with the main body 251 and is bent relative to the main body 251, and the bent part 253 is superposed on the inner wall 217. The main body 251 is configured to separate the heat-conducting element 230 from the first electronic component 150, to avoid the heat-conducting element 230 from being in direct contact with the first electronic component 150, which would otherwise cause damage to the first electronic component 150 when the heat-conducting element 230 is dislocated.

Optionally, a surface of the main body 251 away from the heat-conducting element is flush with the first surface 212, and the main body 251 is arranged opposite or in direct contact with the first electronic component 150. In other words, the side of the main body 251 away from the accommodating groove 213 is flush with the first surface 212. It should be noted that, when the main body 251 is flush with the first surface 212, the functions of the protective member 250 and the heat-conducting element 230 can be realized without changing the thickness of the middle frame 210, thereby keeping the electronic device 100 light and thin.

In the embodiments of the present disclosure, the protective member 250 bridges the first receiving area 211 and the second receiving area 215, and is arranged opposite each of the first electronic component 150 and the second electronic component 170. Therefore, the protective member 250 also separates the second electronic component 170 from the heat-conducting element 230 to prevent the heat-conducting element 230 from causing damage to the first electronic component 150 and the second electronic component 170.

Optionally, the bent part 253 is connected to an edge of the main body 251, and has a one-time bent structure that is bent once relative to the edge of the main body 251 (as shown in FIG. 6). In this case, the bent part 253 extends in a direction facing away from the first surface 212. The bent part 253 is substantially perpendicular to the main body 251, and is arranged opposite the inner wall 217, so that a receiving space is defined jointly by the bent part 253 and the main body 251. The accommodating space can be configured to accommodate the heat-conducting element 230, so as to facilitate the installation and positioning of the heat-conducting element 230.

Figure 7:
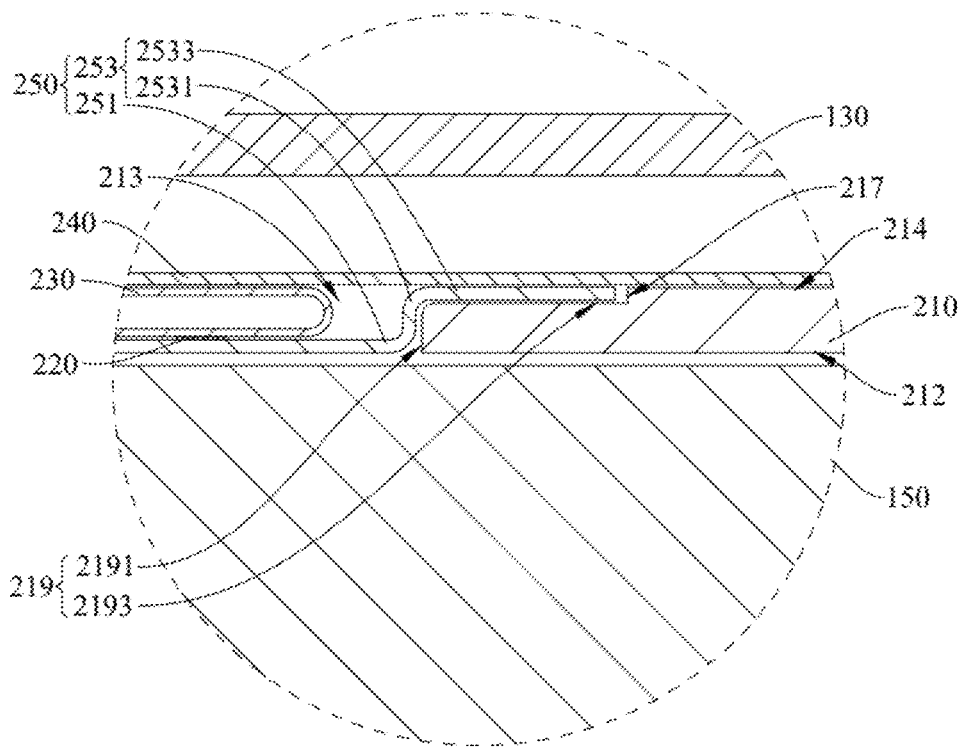
FIG. 7 is an enlarged schematic diagram of another implementation of region VI of the electronic device shown in FIG. 5.

Optionally, referring to FIG. 7, the bent part 253 is connected to an edge of the main body 251, and has a double-bent structure that is bent twice relative to the edge of the main body 251. In this case, the housing 200 may further include a mounting part 219 configured to bear the double-bent structure, so as to limit the position of the double-bent structure. Specifically, the mounting part 219 is connected to the inner wall 217. The mounting part 219 is a protrusion protruding from the inner wall 217 toward the accommodating groove 213.

In the embodiments of the present disclosure, the bent part 253 may be superposed on the mounting part 219. Specifically, the mounting part 219 includes an end surface 2191 that is away from and substantially parallel to the inner wall 217, and a side surface 2193 connected between the end surface 2191 and the inner wall 217. The side surface 2193 faces away from the first surface 212, and is substantially parallel to the first surface. The mounting part 219 also includes a connecting surface (not shown in the figure) away from the side surface 2193 and flush with the first surface 212. Further, the surface on a side of the mounting part 219 that is away from the first receiving area 211, that is, the side surface 2193, is recessed relative to the second surface 214 of the middle frame 210, to form a stepped structure. That is, a distance between the connecting surface and the side surface 2193 is smaller than a distance between the first surface 212 and the second surface 214.

Further, the bent part 253 includes a first bent portion 2531 and a second bent portion 2533. The first bent portion 2531 is connected between the main body 251 and the second bent portion 2533. The first bent portion 2531 is superposed on the end surface 2191, and the second bent portion 2533 is superposed on the side surface 2193. In the embodiments of the present disclosure, the main body 251 is generally sheet-shaped, and is flush with the first surface 212. The first bent portion 2531 is connected to an edge of the main body 251 and is bent relative to the main body 251, and extends in a direction facing away from the first electronic component 150. An included angle between the first bent portion 2531 and the main body 251 is approximately 90°, so that the first bent portion 2531 is opposite to the end surface 2191. It can be understood that, the included angle between the first bent portion 2531 and the main body 251 can be any angle, to limit the heat-conducting element 230 and improve the protection of the heat-conducting element 230.

Further, a plane where the second bent portion 2533 is located is substantially parallel to a plane where the main body 251 is located. For example, the second bent portion 2533 is connected to an end of the first bent portion 2531 away from the main body 251 and is bent relative to the first bent portion 2531, and extends toward the inner wall 217. A gap may be left between the second bent portion 2533 and the inner wall 217, and a surface of the second bent portion 2533 that is away from the side surface 2193 is flush with the second surface 214. An included angle between the first bent portion 2531 and the second bent portion 2533 is also approximately 90°, so that the second bent portion 2533 is opposite to and superposed on the side surface 2193. It can be understood that the included angle between the second bent portion 2533 and the first bent portion 2531 can be any angle to match the stepped structure formed by the mounting part 219 and the second surface 214, so that the connection between the protective member 250 and the mounting part 219 is relatively stable. As such, it is possible to prevent the protective member 250 from falling off and thus prevent the isolation, provided by the protective member 250, between the heat-conducting element 230 and the first electronic component 150 from being affected by such falling off.

Optionally, there are two mounting parts 219 disposed opposite each other in the accommodating groove 213 to further limit the position of the protective member 250 when the protective member is accommodated in the accommodating groove 213. Correspondingly, the protective member 250 includes two bent parts 253 respectively connected to opposite sides of the main body 251, and each of the two bent parts is superposed on a respective one of the two mounting parts 219, thereby improving the protection to the heat-conducting element 230. Further, by limiting the position of the protective member 250 through the two end surfaces 2191 of the two mounting parts 219, the protective member 250 can be prevented from shaking when the protective member 250 is accommodated in the accommodating groove 213.

In the embodiments of the present disclosure, the protective member 250 is made from a metal sheet with a good thermal conductivity, such as a copper sheet or an iron sheet, so as not to affect the heat transferring effect of the heat-conducting element 230 while playing a role in protection. The main body 251, the first bent portion 2531, and the second bent portion 2533 may be integrally formed, for example by die-casting, stamping, and other processes.

Referring to FIG. 7, the heat-conducting element 230 is accommodated in the accommodating groove 213, and is disposed on a side of the protective member 250 that is away from the first electronic component 150. The heat-conducting element 230 is opposite to the main body 251, and the bent part 253 limits the position of the heat-conducting element 230. In the present embodiment, opposite ends of the heat-conducting element 230 are located at positions corresponding to the first receiving area 211 and the second receiving area 215, respectively, so that the heat-conducting element 230 can balance the heat of the first receiving area 211 and the heat of the second receiving area 215. Optionally, when the protective member 250 includes two bent parts 253, the two bent parts 253 are respectively connected to opposite sides of the main body 251 to form two opposite ends of the protective member 250. The two opposite ends of the protective member 250 correspond to the opposite ends of the heat-conducting element 230, respectively, to limit the position of the heat-conducting element 230, thereby preventing the heat-conducting element 230 from shaking side to side. It should be noted that, since the protective member 250 is fixed in the accommodating groove 213, it will not be displaced due to shaking. Accordingly, even if the heat-conducting element 230 is dislocated, it will not damage the first electronic component 150, which improves the reliability of the electronic device 100.

Figure 8:
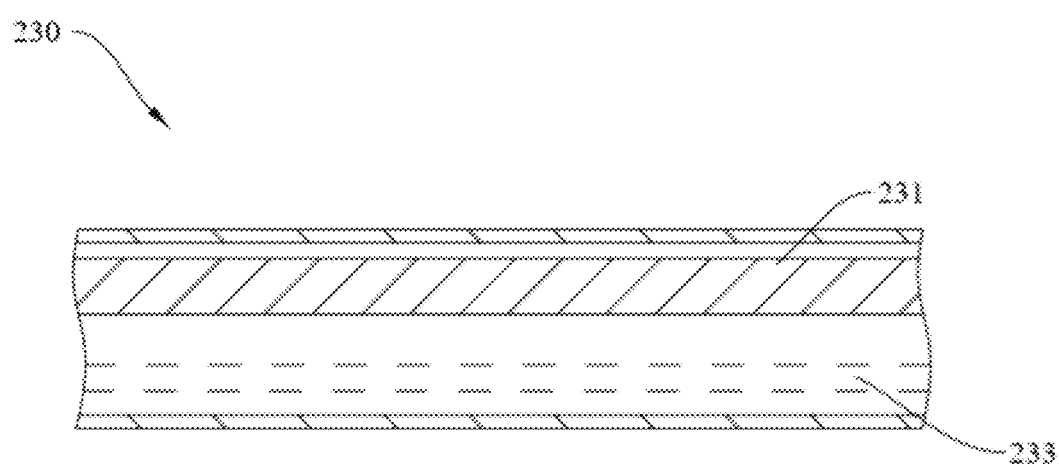
FIG. 8 is a schematic cross-sectional view of the heat-conducting element of the electronic device shown in FIG. 1.

Referring to FIG. 8, in the embodiments of the present disclosure, the heat-conducting element 230 is tubular, and the heat-conducting element 230 is provided with an inner cavity. The heat-conducting element 230 includes a capillary layer 231 and a working medium 233. The capillary layer 231 and the working medium 233 overlap each other, and are both arranged in the inner cavity. The working medium 233 is a medium capable of generating gas-liquid phase changes in a sealed space, such as water, alcohols, and chlorofluorocarbons (CFC) substitutes. Since the working medium 233 needs to absorb a lot of heat when it is transformed from the liquid phase to the gas phase, and the working medium 233 in the gas phase transfers heat from one location to another location during the process of spreading toward the surroundings, the heat conduction is realized in the electronic device 100. Thus, the heat balance and heat dissipation of the electronic device 100 are realized. The heat balance of the electronic device 100 means that the local heat in the electronic device 100 is transferred and dispersed to prevent the heat from being concentrated in a local portion of the electronic device 100.

Further, the capillary layer 231 has tiny concave-convex structures, such as pores, grooves and protrusions, to increase the surface area of the capillary layer 231 and facilitate the adhesion of the working medium 233 in the gas phase to the capillary layer 231, thereby improving the speed at which the working medium 233 in the gas phase is condensed into the working medium 233 in the liquid phase, and thus improving the heat dissipation performance of the electronic device 100. The specific structure of the capillary layer 231 may include one of a porous structure, a fibrous structure, a groove structure, and a net structure, or a combination thereof. Optionally, the capillary layer 231 may be an independent element, for example, the capillary layer 231 is a metal weaved mesh which is connected to the inner surface of the heat-conducting element 230 by means of sintering or the like. Also optionally, the capillary layer 231 may be a tiny structure formed on the inner surface of the heat-conducting element 230 by etching or the like.

Specifically, the working process of the heat-conducting element 230 is explained by taking a case where an end of the heat-conducting element 230 close to the second electronic component 170 is an evaporation end, and an end thereof close to the first electronic component 150 is a condensation end, as an example. When the evaporation end of the heat-conducting element 230 close to the second electronic component 170 is heated, the working medium 233 in the liquid phase absorbs the heat and evaporates at the evaporation end, and becomes the working medium 233 in the gas phase to move and spread toward the condensation end. When the working medium 233 in the gas phase moves to the condensation end, it can radiate the heat and be condensed into the working medium 233 in the liquid phase, to dissipate the heat carried by the working medium 233 in the gas phase from the middle frame 210 through the first receiving area 211, to realize the heat balance of the electronic device 100. In addition, when the working medium 233 in the gas phase moves and spreads toward the condensation end, it can also be partially condensed into the working medium 233 in the liquid phase, and then flow back, by means of the capillary layer 231, to the evaporation end to repeat the above working procedures, so as to realize the cyclical movement of the working medium 233, thereby speeding up the process of transferring the heat from the evaporation end to the condensation end.

It should be noted that, since the volume of the second electronic component 170 is smaller compared with the first electronic component 150, the local overheating of the electronic device 100 is likely to be caused when the second electronic component 170 generates heat. However, the heat-conducting element 230 can transfer the heat of the second electronic component 170 to the location where the first electronic component 150 is located, so as to realize the heat balance of the electronic device 100. With regard to transferring the heat to the first electronic component 150 through the heat-conducting element 230, it actually means that the heat is transferred to the region where the first receiving area 211 is located, so as to realize the heat balance of the electronic device 100, and then, the heat is dissipated to the middle frame 210 through the first receiving area 211.

Referring to FIG. 6 again, the housing 200 may further include an adhesive layer 220, and the adhesive layer 220 is sandwiched between the protective member 250 and the heat-conducting element 230. The adhesive layer 220 may be a layer of adhesive such as glue, or a cohesive body such as a double-sided tape. The cohesive force of the adhesive layer 220 stabilizes the connection between the protective member 250 and the heat-conducting element 230, thereby avoiding the separation of the protective member 250 from the heat-conducting element 230 under an external force. Thus, it is ensured that the protective member 250 can reliably isolate the heat-conducting element 230 from the first electronic component 150, to prevent the first electronic component 150 from being damaged by the heat-conducting element 230 when the heat-conducting element 230 is dislocated.

Continuing to refer to FIG. 6, the housing 200 further includes a heat dissipation element 240. The heat dissipation element 240 is laid on a side of the heat-conducting element 230 that is away from the protective member 250, and is connected to the middle frame 210. In the embodiments of the present disclosure, the heat dissipation element 240 is superposed on the second surface 214 and covers the side of the accommodating groove 213 that is away from the first receiving area 211. Further, the heat dissipation element 240 includes at least one of a graphite sheet and a thermally conductive gel. The heat dissipation element 240 is superposed on the surface of the heat-conducting element 230 and the surface of the middle frame 210 to dissipate the heat transferred by the heat-conducting element 230, so as to improve the heat dissipation performance of the electronic device 100. Optionally, the heat dissipation element 240 is sheet-shaped, and the sheet-shaped heat dissipation element 240 may be laid on the second surface 214, the second bent portion 2533, and the heat-conducting element 230 in sequence, so that the second bent portion 2533 and the heat-conducting element 230 are not easy to fall off from the accommodating groove 213, to further strengthen the structure of the middle frame 210. In addition, the sheet-shaped heat dissipation element 240 can increase the heat dissipation area, thereby increasing the heat dissipation rate. In the housing 200 and the electronic device 100 provided in the embodiments of the present disclosure, the protective member 250 is arranged opposite or in contact with the first electronic component 150 provided in the first receiving area 211, so as to transfer the heat of the first receiving area 211 to other locations of the electronic device 100, or transfer the heat from other locations to the first receiving area 211, thereby realizing the heat balance of the electronic device 100, avoiding the local overheating of the electronic device 100, and improving the heat dissipation efficiency of the electronic device 100. In addition, by providing the protective member 250, the first electronic component 150 can be prevented from being damaged by the heat-conducting element 230 when the heat-conducting element is dislocated (for example, when it is impacted by an external force, or when the structure is loose), thereby improving the reliability of the electronic device 100.

In some other embodiments, an electronic device is also provided. The electronic device includes the housing mentioned in the above embodiments, a first electronic component, and a second electronic component. The first electronic component is accommodated in the first receiving area. The second electronic component is connected to the middle frame, and is spaced apart from the first electronic component. The protective member includes a first section and a second section connected to the first section. The first section is arranged opposite the first electronic component, and the second section is arranged opposite the second electronic component.

In some embodiments, the first electronic component may be a battery to supply power required for the normal operation of the electronic device. The second electronic component may include any one or more of a chip, a central processing unit, a camera, a fingerprint recognition module, and a sensor, so as to realize related functions of the electronic device. The chip may be a driver chip, a detection chip, etc., which will not be detailed here.

As an implementation, the first electronic component and the second electronic component may be arranged on a same side of the middle frame, or may be arranged on opposite sides of the middle frame. Through the first section and the second section of the protective member, the first electronic component and the second electronic component both can be opposite to the protective member, so as to prevent the first electronic component and the second electronic component from being damaged by the heat-conducting element when the heat-conducting element is dislocated, so as to prolong the service life of electronic equipment.

The "electronic device" used in the embodiments of this disclosure includes, but is not limited to, a device that receives and sends communication signals via a wired line (for example, via Public Switched Telephone Network (PSTN), Digital Subscriber Line (DSL), a digital cable or direct cable connection, and/or via another data connection/network), and/or via a wireless interface (for example, a wireless interface for cellular network, Wireless Local Area Network (WLAN), digital TV network such as Digital Video Broadcasting Handheld (DVB-H) network, satellite network, or Amplitude Modulation-Frequency Modulation (AM-FM) broadcast transmitter, and/or a wireless interface of another communication terminal). The communication terminal configured to communicate via a wireless interface may be referred to as a "wireless communication terminal", a "wireless terminal" and/or an "electronic device". Examples of the electronic device include, but are not limited to, satellites or cellular phones; Personal Communication System (PCS) terminals that can combine cellular radio phones with data processing, faxing and data communication capabilities; Personal digital assistants (PDA) that can incorporate a radio phone, a pager, Internet/intranet accessing, a web browser, a memo pad, calendar and/or a Global Positioning System (GPS) receiver; and conventional laptop and/or handheld receiver or other electronic device including a radio phone transceiver.

The foregoing are only preferred embodiments of the disclosure, and are not intended to limit the disclosure. For those skilled in the art, the disclosure can have various modifications and variants. Any modification, equivalent replacement, improvement, etc. made within the spirit and principle of this disclosure shall fall into the protection scope of this disclosure.

What is claimed is:

1. A housing, for an electronic device, the housing comprising:
    a middle frame, provided with a first receiving area and an accommodating groove, wherein the middle frame comprises a first surface and a second surface opposite to each other, the first receiving area is arranged on the first surface and is configured to receive an electronic component of the electronic device, the accommodating groove runs through the middle frame with both the first surface and the second surface penetrated, and the accommodating groove is communicated with the first receiving area;
    a heat-conducting element, accommodated in the accommodating groove; and
    a protective member, wherein the protective member is at least partially accommodated in the accommodating groove, and is located on a side of the heat-conducting element that faces towards the first receiving area;
    wherein the protective member comprises a main body and a bent part, the bent part being connected with the main body and bent relative to the main body, the main body covering a side of the accommodating groove that is communicated with the first receiving area, the main body separating the heat-conducting element from the electronic component received in the first receiving area.

2. The housing as claimed in claim 1, wherein the electronic component received in the first receiving area is a battery of the electronic device;
    wherein the middle frame is further provided with a second receiving area configured to receive a further electronic component of the electronic device, and the second receiving area and the first receiving area are located on a same side of the middle frame; and
    wherein the accommodating groove is configured to span across the first receiving area and the second receiving area and be communicated with the first receiving area and the second receiving area.

3. The housing as claimed in claim 2, wherein the protective member is configured to span across the first receiving area and the second receiving area; one end of the protective member is arranged opposite the first receiving area, and an opposite end of the protective member is arranged opposite the second receiving area.

4. The housing as claimed in claim 1, wherein the heat-conducting element is provided with an inner cavity, and the heat-conducting element comprises a capillary layer and a working medium both provided in the inner cavity;
    wherein the working medium is configured to generate gas-liquid phase change in the inner cavity; and
    wherein the capillary layer has at least one structure selected from: a porous structure, a fibrous structure, a groove structure, and a net structure.

5. The housing as claimed in claim 1, wherein the housing further comprises an adhesive layer sandwiched between the protective member and the heat-conducting element.

6. The housing as claimed in claim 1, wherein the middle frame comprises an inner wall located between the first surface and the second surface, and the accommodating groove is enclosed by the inner wall;
    wherein the bent part is arranged opposite the inner wall.

7. The housing as claimed in claim 6, wherein the housing further comprises a mounting part connected to the inner wall, the mounting part protruding from the inner wall toward the accommodating groove, and the bent part being superposed on the mounting part.

8. The housing as claimed in claim 7, wherein a side surface of the mounting part that is away from the first surface is recessed with respect to the second surface of the middle frame, to form a stepped structure, and the bent part of the protective member is partially superposed on the side surface of the mounting part.

9. The housing as claimed in claim 8, wherein the mounting part further comprises an end surface away from the inner wall, and the side surface is connected between the end surface and the inner wall; and
   wherein the bent part comprises a first bent portion and a second bent portion, the first bent portion being connected between the main body and the second bent portion, the first bent portion being superposed on the end surface, and the second bent portion being superposed on the side surface.

10. The housing as claimed in claim 9, wherein the first bent portion is bent relative to the main body, and extends perpendicular to the main body; and
   wherein the second bent portion is bent relative to the first bent portion and extends toward the inner wall, and the second bent portion is parallel to the main body.

11. The housing as claimed in claim 10, wherein a surface of the second bent portion that is away from the side surface is flush with the second surface of the middle frame.

12. The housing as claimed in claim 9, wherein a side of the main body facing away from the heat-conducting element is flush with the first surface of the middle frame.

13. The housing as claimed in claim 9, wherein the protective member further comprise another bent part, the bent part is connected to one side of the main body, and the another bent part is connected to an opposite side of the main body; and
   wherein the housing further comprises another mounting part, the mounting part and the another mounting part are arranged opposite each other, and each of the bent part and the another bent part is superposed on a respective one of the mounting part and the another mounting part.

14. The housing as claimed in claim 1, wherein the protective member is made from a metal sheet.

15. The housing as claimed in claim 1, wherein the housing further comprises a heat dissipation element; the heat dissipation element is overlaid on a side of the heat-conducting element that is away from the protective member, and is superposed on the second surface of the middle frame; and
   wherein the heat dissipation element comprises at least one selected from a graphite sheet and a thermally conductive gel.

16. An electronic device, comprising:
   a housing, comprising:
      a middle frame, comprising a first side and a second side opposite to each other, a first receiving area being provided on the first side, an accommodating groove being provided in and penetrating the middle frame, and the accommodating groove being communicated with the first receiving area;
      a heat-conducting element, accommodated in the accommodating groove; and
      a protective member, at least partially accommodated in the accommodating groove;
   a first electronic component, accommodated in the first receiving area and arranged opposite the protective member, the first electronic component being separated by the protective member from the heat-conducting element; and
   a display panel, arranged on the second side of the middle frame; wherein the protective member comprises a main body and a bent part, the bent part being connected with the main body and bent relative to the main body, the main body covering a side of the accommodating groove that is communicated with the first receiving area, the main body separating the heat-conducting element from the electronic component received in the first receiving area.

17. The electronic device as claimed in claim 16, wherein a second receiving area is further provided on the first side of the middle frame, the accommodating groove is communicated with both the first receiving area and the second receiving area, one end of the protective member is arranged opposite the first receiving area, and an opposite end of the protective member is arranged opposite the second receiving area; and
   wherein the electronic device further comprises a second electronic component accommodated in the second receiving area; both the first electronic component and the second electronic component are arranged opposite the protective member.

18. The electronic device as claimed in claim 17, wherein the first electronic component is a battery, and the second electronic component comprises one or more selected from a group consisting of a central processing unit, a camera, a fingerprint recognition module, and a sensor.

19. An electronic device, comprising:
   a housing, comprising:
      a middle frame, comprising a first side and a second side opposite to each other, a receiving area being provided on the first side, an accommodating groove being provided in and penetrating the middle frame, and the accommodating groove being communicated with the receiving area;
      a heat-conducting element, accommodated in the accommodating groove; and
      a protective member, at least partially accommodated in the accommodating groove;
   a first electronic component, arranged in a first part of the receiving area of the middle frame; and
   a second electronic component, arranged in a second part of the receiving area of the middle frame and spaced apart from the first electronic component;
   wherein the protective member comprises a first section and a second section connected to the first section, the first section is arranged opposite the first electronic component, and the second section is arranged opposite the second electronic component;
   wherein the protective member comprises a main body and a bent part, the bent part being connected with the main body and bent relative to the main body, the main body covering a side of the accommodating groove that is communicated with the first receiving area, the main body separating the heat-conducting element from the electronic component received in the first receiving area.

20. The electronic device as claimed in claim 19, wherein each of the first section and the second section comprises a main body and a bent part connected with the main body, the main body separates the heat-conducting element from the first electronic component and the second electronic component, the bent part is bent relative to the main body, the bent part is arranged opposite an inner wall of the middle frame, and the accommodating groove is enclosed by the inner wall.

* * * * *